United States Patent

Kondo et al.

[11] Patent Number: 5,949,294
[45] Date of Patent: Sep. 7, 1999

[54] REFERENCE FREQUENCY SOURCE OSCILLATOR FORMED FROM FIRST AND SECOND CONTAINERS

[75] Inventors: Shuji Kondo, Takarazuka; Yuki Satoh, Katano; Mitsuo Suzuki, Yokohama; Akio Kimura, Utsunomiya, all of Japan

[73] Assignee: Matsushita Electric Industrial Co., Ltd., Osaka, Japan

[21] Appl. No.: 08/932,355

[22] Filed: Sep. 17, 1997

[30] Foreign Application Priority Data

Sep. 20, 1996 [JP] Japan ................................. 8-248438

[51] Int. Cl.⁶ ........................................................ H03H 9/10
[52] U.S. Cl. ........................... 331/68; 361/728; 361/753; 361/730; 361/820; 310/340; 310/348
[58] Field of Search ............................... 331/68; 310/340, 310/348; 361/728, 753, 730, 820

[56] References Cited

U.S. PATENT DOCUMENTS

| | | | |
|---|---|---|---|
| 4,611,182 | 9/1986 | Chauvin et al. | 331/69 |
| 4,627,533 | 12/1986 | Pollard | 331/177 R |
| 4,750,246 | 6/1988 | Pollard | 29/25.35 |
| 5,025,228 | 6/1991 | Gerard et al. | 331/69 |

FOREIGN PATENT DOCUMENTS

0727872  8/1996  European Pat. Off. .

*Primary Examiner*—Arnold Kinkead
*Attorney, Agent, or Firm*—Pearne, Gordon, McCoy & Granger LLP

[57] ABSTRACT

An oscillator in which organic substances derived from an active element fixing adhesive do not deposit on an oscillating element and in which when the active element or the oscillating element is damaged, other good parts that are not defective can be reused. In the oscillator, an active element 2 is mounted inside a first container 1 whose upper surface is opened, and not only the opening of the first container 1 is closed by an oscillating unit 3 having an oscillating element 6 incorporated therein, but also the oscillating unit 3 is attached onto the opening of the first container 1, so that second connecting electrodes 11a to 11d of a second container 5 of the oscillating unit 3 are electrically connected to first connecting electrodes 14a to 14d of the first container 1. As a result of this construction, the oscillating element and the active element can be accommodated in separate containers, which not only prevents organic substances derived from an active element fixing adhesive from being deposited on the oscillating element, but also parts that are not defective can be reused only by separating the first container from the second container if the active element or the oscillating element is damaged.

12 Claims, 11 Drawing Sheets

REFERENCE FREQUENCY SOURCE OSCILLATOR FORMED FROM FIRST AND SECOND CONTAINERS

BACKGROUND OF THE INVENTION

The invention relates to an oscillator to be used as a reference frequency source of mobile communication equipments such as portable telephones.

Generally, oscillators of this type have such structure that an oscillating element and an active element therefor are accommodated in a single container.

Such an oscillator having both the active element and the oscillating element accommodated in a single container addresses the problem that organic substances emitted from a resin-containing adhesive used for fixing the active element deposit on the oscillating element to thereby deteriorate the oscillation characteristics of the oscillating element.

To overcome this problem, the following technique has recently been proposed. The inside of a container having openings on both ends thereof is partitioned into two chambers, and the oscillating element is accommodated in one of the chambers and the active element in the other, so that deposition of organic substances emitted from the resin-containing adhesive used for fixing the active element on the oscillating element can be prevented.

However, the aforementioned oscillator having two chambers is disadvantageous in terms of costs. That is, such oscillator is prepared by: first, mounting an oscillating element in one of the two chambers and sealing the corresponding opening of the chamber after frequency adjustments have been made; and then, mounting the active element in the other chamber and writing temperature compensation data to the active element. If the active element is damaged at the time of being mounted or at the time of writing the temperature compensation data, not only the active element but also the oscillating element must be disposed of together with the container. Hence, this type of oscillator has been costly.

That is, if the active element is damaged, one may suggest that only the active element be removed from the other chamber of the container and replaced with a new one. However, in actuality, the active element is fixed by a resin-containing adhesive, so that the active element is not easy to remove, thus ending up in damaging also the container in some cases.

SUMMARY OF THE INVENTION

The object of the invention is, therefore, to provide an oscillator having such a structure that organic substances derived from an active element fixing adhesive do not deposit on an oscillating element and that if the active element or the oscillating element is damaged, other good parts that are not defective can be reused.

An oscillator of the invention has a first container whose upper surface is opened and an oscillating unit to be attached so as to cover the opening of the first container. The oscillating unit has a second container whose upper surface is opened, an oscillating element mounted inside the second container, and a sealing plate attached onto the opening on the upper surface of the second container, and a second connecting electrode is electrically connected to a first connecting electrode of the first container.

According to the invention, an oscillator of such structure that not only organic substances derived from an active element fixing resin-containing adhesive do not deposit on the oscillating element but also if the active element or the oscillating element is damaged, other good parts that are not defective can be reused.

DETAILED DESCRIPTION OF THE PREFERRED EMBODIMENTS

Embodiments of the invention will now be described with reference to FIGS. 1 to 18.

First Embodiment

FIGS. 1 to 10 show the first embodiment.

Figure 1:
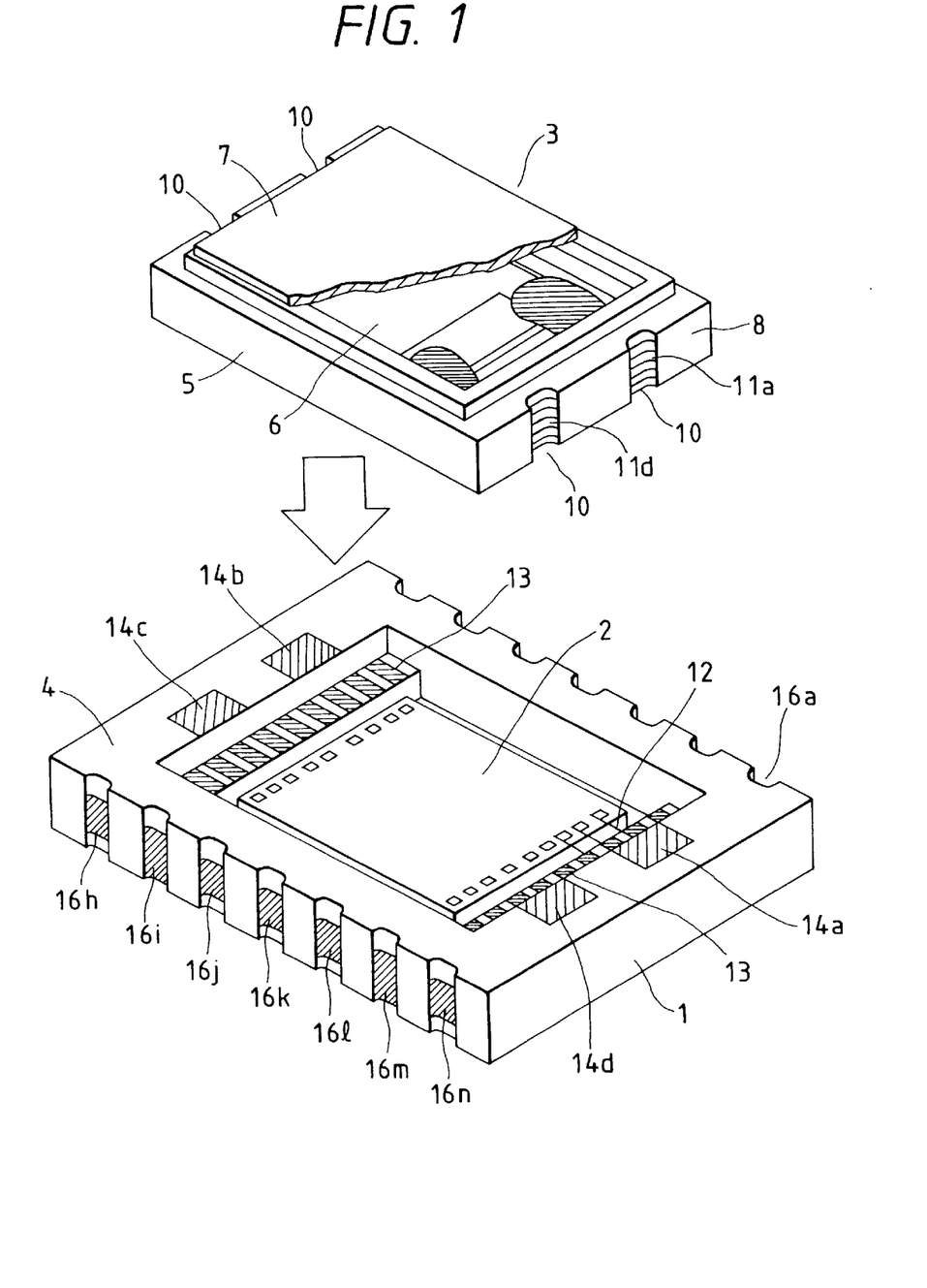
FIG. 1 is an exploded perspective view of an oscillator according to a first embodiment.
Figure 6:
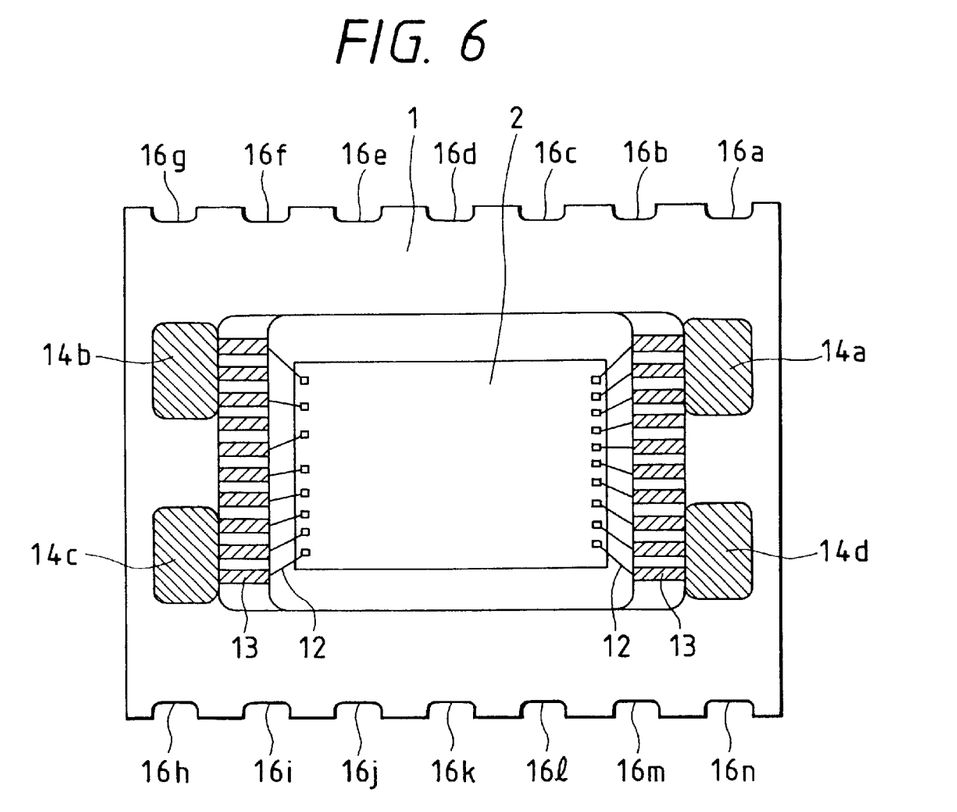
FIG. 6 is a plan view of a first container of the first embodiment with an active element attached.
Figure 7:
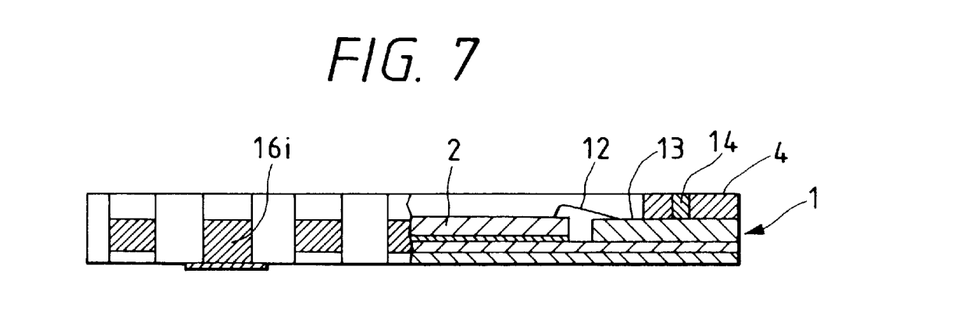
FIG. 7 is a half-sectional view of the front of the first container of the first embodiment.

In FIGS. 1 to 5, a first container 1 is formed of a laminated body of ceramic sheets, and is box-shaped with the upper surface thereof opened as shown in FIGS. 1, 6 and 7. An active element 2 constructed of a bare chip is mounted inside the first container 1 while fixed by an adhesive.

Figure 8:
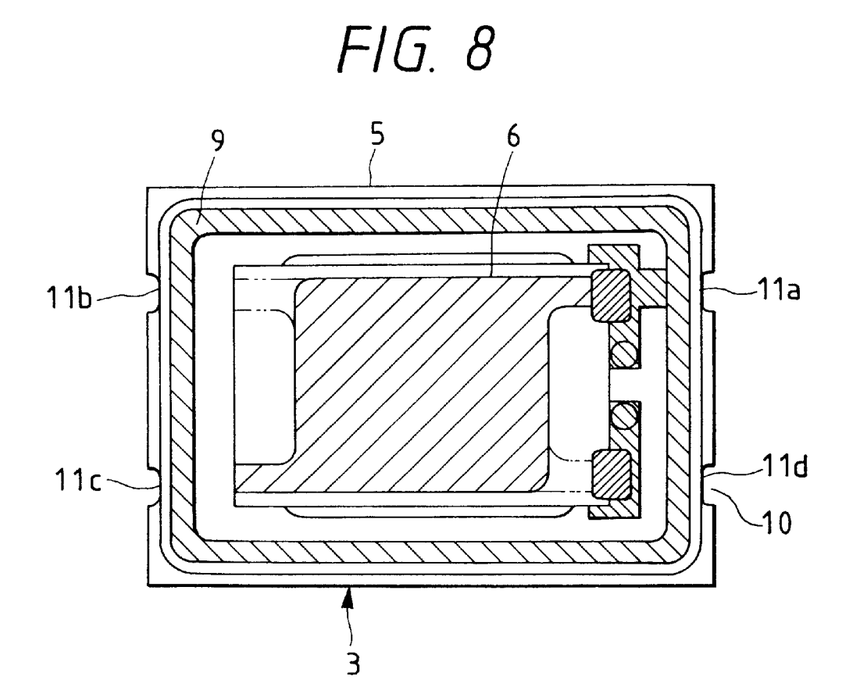
FIG. 8 is a plan view of the first embodiment with a shield plate of a second container removed.
Figure 9:
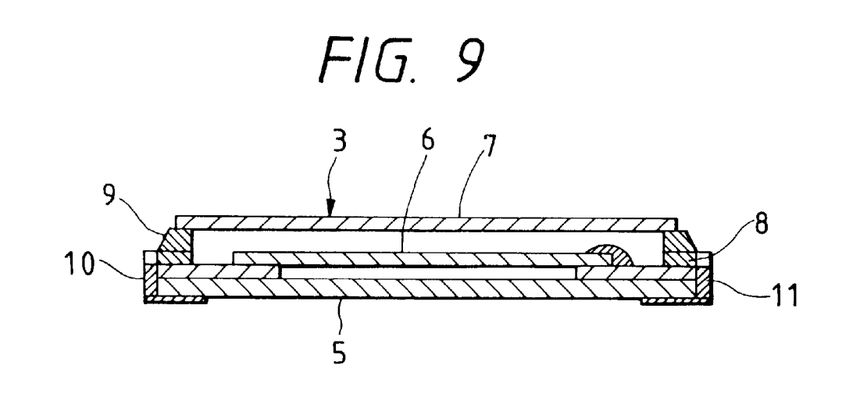
FIG. 9 is a sectional view of the front of the second container of the first embodiment.

An oscillating unit 3 is attached onto an outer peripheral wall 4 of the first container 1 so as to cover the opening of the first container 1. As shown in FIGS. 1, 8 and 9, the oscillating unit 3 has a second container 5, an oscillating element 6, and a shield plate 7. The second container 5 is formed of a laminated body of ceramic sheets with the upper surface thereof opened. The oscillating element 6 is constructed of a crystal oscillator mounted inside the second container 5. The shield plate 7 made of a metal plate is attached to the opening of the second container 5 as an exemplary sealing plate. The oscillating element 6 is hermetically sealed inside the second container 5 by welding the shield plate 7 to a seam ring 9 that is fixed onto an outer peripheral wall 8 of the second container 5. It may be noted that hermetic sealing may be implemented by glass, solder, Au-Sn alloys, and the like.

Figure 2:
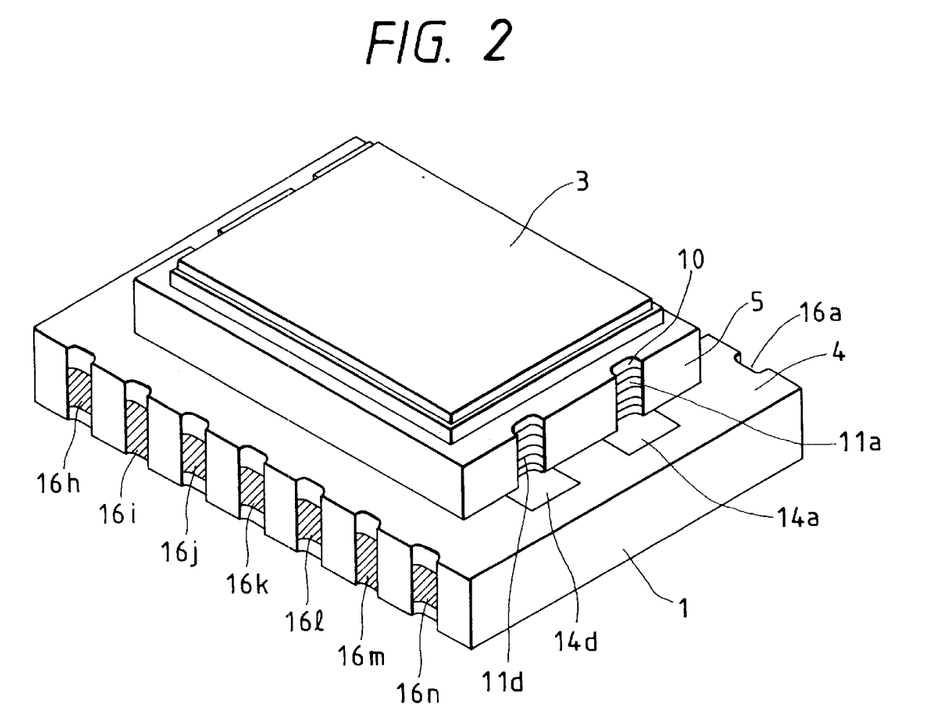
FIG. 2 is a perspective view showing an appearance of the first embodiment.
Figure 10:
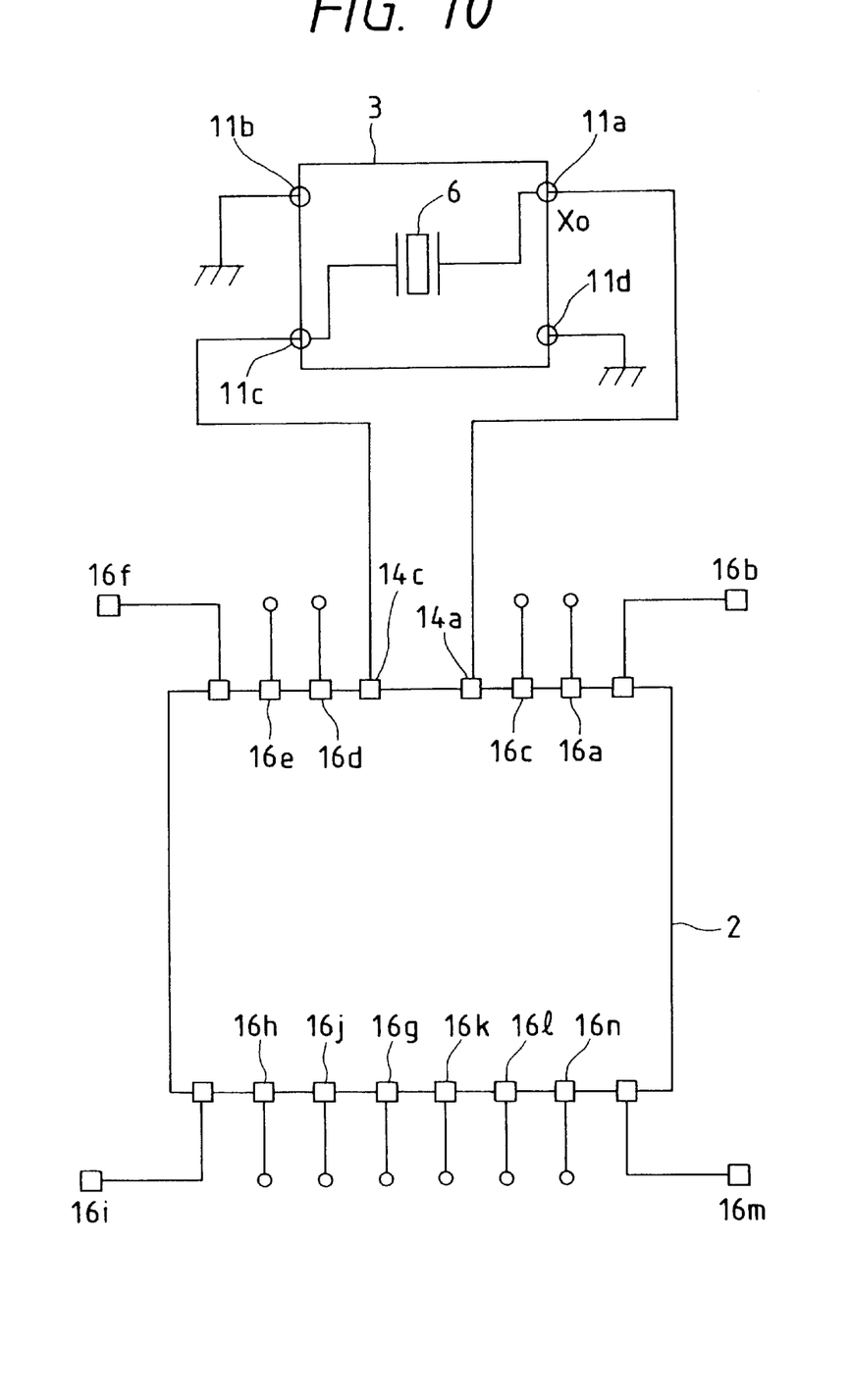
FIG. 10 is an electrical block diagram of the first embodiment.

As shown in FIGS. 1 and 2, semicircular notches 10 are formed at four points on the outer peripheral surface of the outer peripheral wall 8 of the second container 5. As shown in FIG. 8, second connecting electrodes 11a to 11d are formed both on the inner sides of the notches 10 and on the bottom surface continuous to the notches 10. As shown in FIG. 10, the second connecting electrodes 11a and 11c these electrodes are electrically connected to the oscillating element 6, whereas the second connecting electrodes 11b and 11d are electrically connected to the seam ring 9 to be grounded.

On the other hand, the active element 2 mounted on the first container 1 is, as shown in FIGS. 6 and 7, electrically connected to electrodes 13 by wires 12, and first connecting electrodes 14a to 14d, each of which is connected to either one of the electrodes 13, are arranged at four points on the outer peripheral wall 4 of the first container 1.

The first connecting electrodes 14a to 14d and the second connecting electrodes 11a to 11d are electrically connected by a conductive adhesive A such as thermal hardening conductive resin or solder in such a manner that: the connecting electrode 14a is connected to the connecting, electrode 11a; the connecting electrode 14b is connected to the connecting electrode 11b; the connecting electrode 14c is connected to the connecting electrode 11c; and the connecting electrode 14d is connected to the connecting electrode 11d. As a result, the oscillating element 6 is electrically connected to the active element 2. It may be noted that the active element 2 is connected through flip-chip mounting instead of connection through the wires 12.

Figure 3:
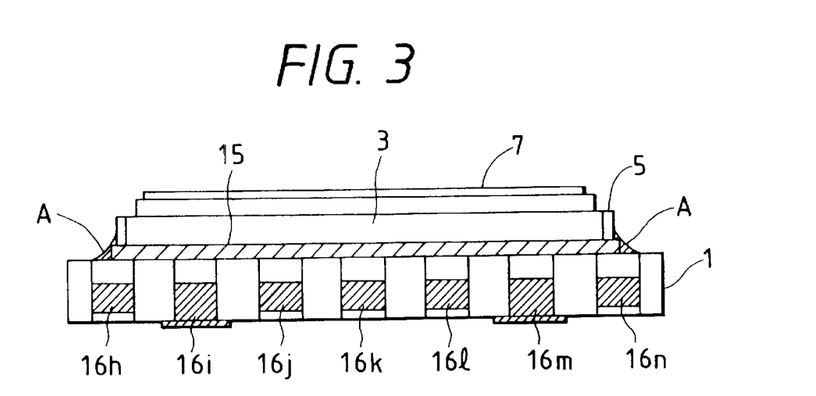
FIG. 3 is a front view of the first embodiment.
Figure 4:
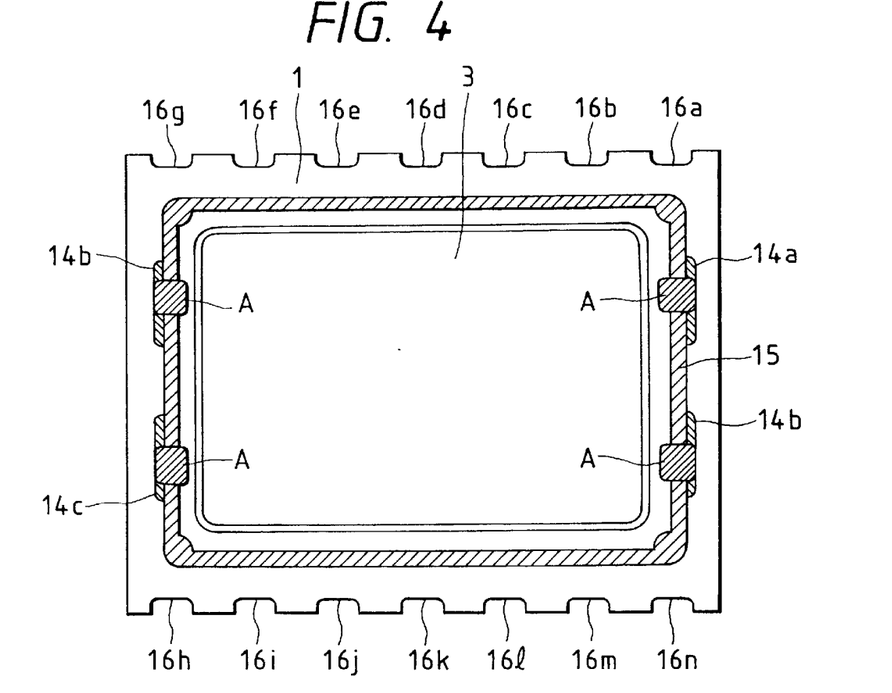
FIG. 4 is a plan view of the first embodiment.
Figure 5:
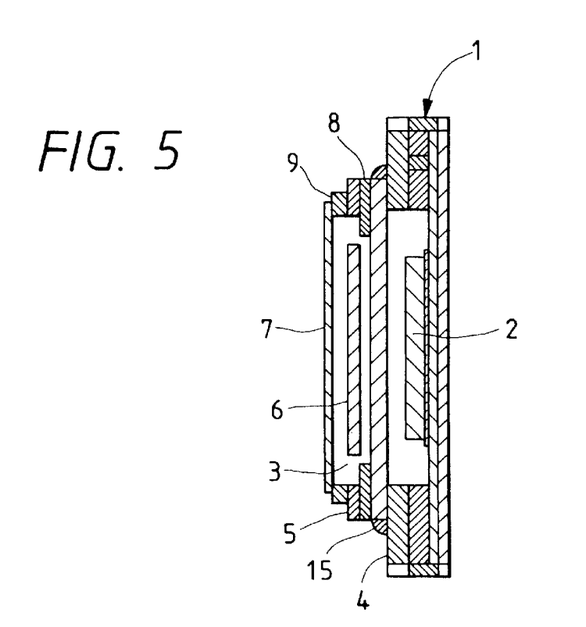
FIG. 5 is a side sectional view of the first embodiment.

After electrical connection between the first electrodes 14a to 14d and second electrodes 11a to 11d has been completed, an adhesive seal resin 15 is applied over the outer peripheral portion of the bottom surface of the second container 5 as shown in FIGS. 3 and 4. As a result, not only the second container 5 is bonded and fixed onto the upper surface of the outer peripheral wall 4 of the first container 1, but also the opening on the upper surface of the first container 1 is sealed by the second container 5 to thereby protect the active element 2.

As a result of the opening being thus sealed, resin molding on the outer periphery of the active element 2 is no longer necessary. However, to give more reliable protection of the active element 2, resin molding over the outer periphery of the active element 2 may be made in addition to the sealing of the opening by the second container 5.

Semicircular notches are arranged over the outer periphery of the first container 1, and electrodes 16a to 16n are arranged on the respective notches. Among these electrodes, the electrodes 16b, 16f, 16i, 16m extend not only on the corresponding notches but also to the bottom surface of the first container 1 continuous to such notches. The electrode 16b serves as an AFC terminal; the electrode 16f, a ground terminal; the electrode 16i, an oscillation output terminal (TCXO); and the electrode 16m, a power supply terminal ($V_{DD}$). FIG. 7 shows an example of the electrode 16i. FIG. 10 shows a configuration of this oscillator.

Further, the other electrodes 16a, 16c, 16d, 16e, 16g, 16h, 16j, 16k, 16l, 16n are inspecting electrodes. These electrodes are arranged at positions remote upward by a predetermined distance from the bottom surface of the first container 1. These electrodes are used to write data to a memory within the active element 2 and to carry out various types of inspections.

Here, since these inspecting electrodes are arranged so as to be distanced from the bottom surface of the first container 1, there is no likelihood that conductive patterns on the board are short-circuited to the inspecting electrodes when the first container is mounted on the board.

It may be noted that a varactor diode is arranged inside the active element 2 in addition to the memory. The oscillation frequency of the oscillating element 6 is controlled so as to stay substantially constant independently of temperatures by varying the voltage to be supplied to the cathode of the varactor diode so that the capacitance thereof is changed.

Second Embodiment

Figure 11:
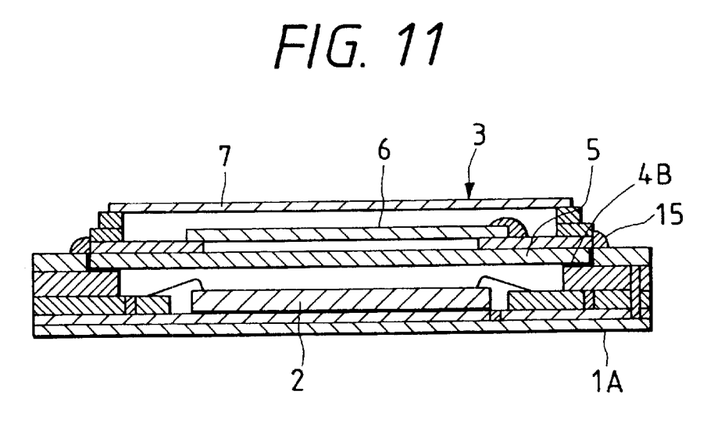
FIG. 11 is a sectional view of the front of an oscillator according to a second embodiment.
Figure 12:
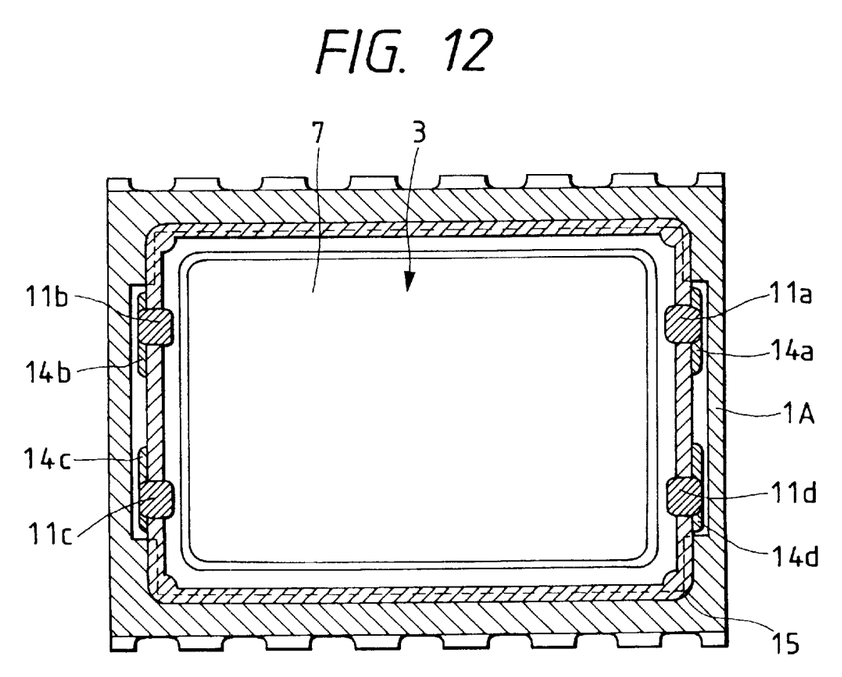
FIG. 12 is a plan view of the second embodiment.
Figure 13:
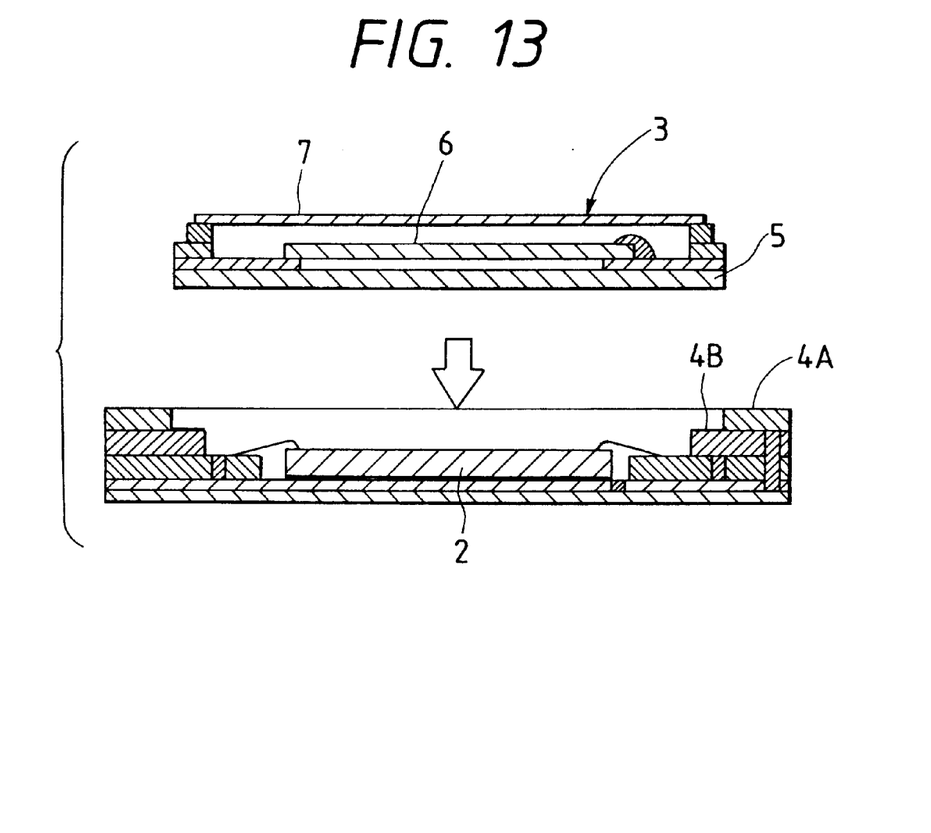
FIG. 13 is an exploded sectional view of the front of the second embodiment.

FIGS. 11 to 13 show the second embodiment.

It may be noted that the same parts and components as those of the first embodiment will be described while denoted by the same reference numerals.

As shown in FIGS. 11 to 13, the second embodiment is characterized in that a recessed step 4B is formed on the upper inner peripheral portion of an outer peripheral wall 4A of a first container 1A, so that a second container 5 is supported by such step 4B.

That is, when the step 4B is formed on the upper surface of the first container 1A and the second container 5 is supported by the step 4B as shown in FIGS. 11 and 13, the second container 5 can be positioned with respect to the first container 1A without having to perform special positioning operation. In addition, relative positions between the first connecting electrodes 14a to 14d and second connecting electrodes 11a to 11d can also be set correctly, which not only allows both connecting electrodes to be electrically connected reliably, but also allows the upper opening of the first container 1A can be sealed by the second container 5 reliably.

Third Embodiment

Figure 14:
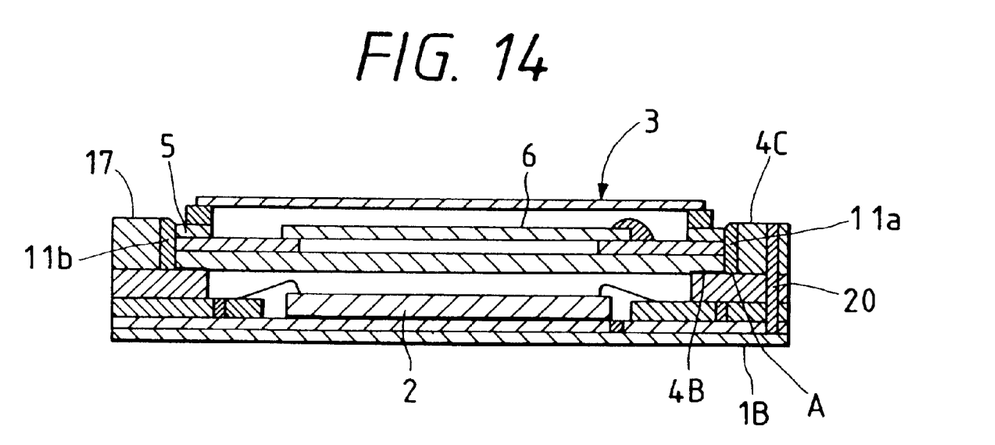
FIG. 14 is a sectional view of the front of a third embodiment.
Figure 15:
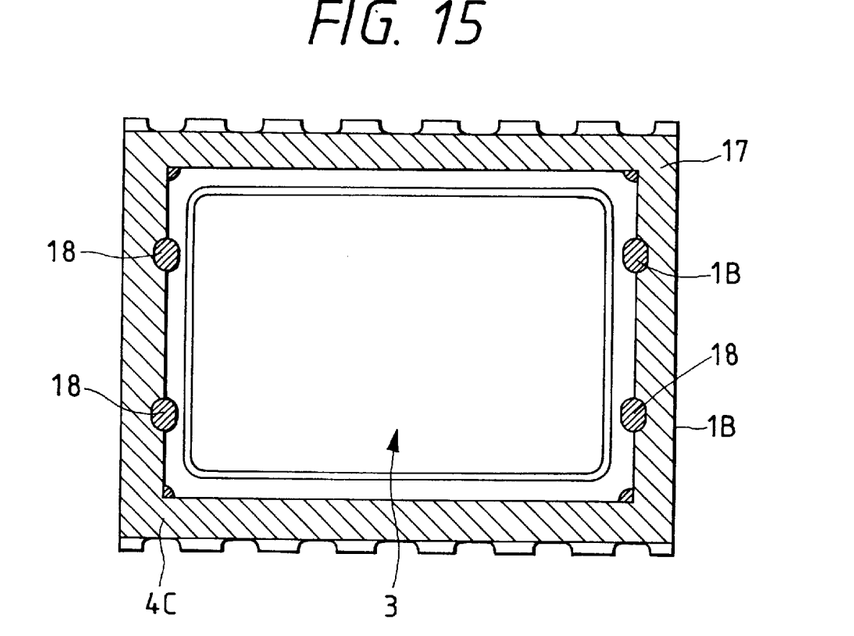
FIG. 15 is a plan view of the third embodiment.

FIGS. 14 and 15 show the third embodiment.

It may be noted that the same parts and components as those of the first and second embodiments will be described while denoted by the same reference numerals.

As shown in FIGS. 14 and 15, the third embodiment is characterized in that an outer peripheral wall 4C of a first container 1B is made higher than in the second embodiment.

More specifically, the upper surface of the first container 1B is extended upward to second connecting electrodes 11a to 11d of a second container 5, and a shield electrode 17 is arranged on the upper surface of the outer peripheral wall 4C so as to extend all along the periphery thereof as shown in FIG. 15.

The shield electrode 17 is electrically connected to an electrode 16f serving as a ground terminal through a conductive path 20 that is formed inside the outer peripheral wall 4C shown in FIG. 14.

Therefore, this shield electrode 17 not only makes it hard for external noise to be picked up by the connecting portions of the first and second connecting electrodes, but also prevents electrostatic destruction of the active element 2 by an operator touching the active element 2 with his or her finger.

Since the conductive adhesive A is made hard to insert into the connecting portions of the first connecting electrodes 14a to 14d and second connecting electrodes 11a to 11d by extending the outer peripheral wall 4C upward, notches 18 extending as high as to a step 4B are formed in the inner surface portions of the outer peripheral wall 4C so as to correspond to the first connecting electrodes 14a to 14d and second connecting electrodes 11a to 11d and the conductive adhesive A is charged into such notches 18. As a result, electric connection between the first connecting electrodes 14a to 14d and second connecting electrodes 11a to 11d is stabilized.

Further, the first and second connecting electrodes can be electrically connected easily as well as reliably in this way, the area occupied by the first and second connecting electrodes can be reduced accordingly, which in turn contributes to further preventing infiltration of external noise into the first and second electrodes.

It may be noted that the conductive adhesive A is charged not as high as to the upper inner portion of the notches 18 and that the upper portion is covered by a bonding seal resin 15 lest the shield electrode 17 should be short-circuited to the first connecting electrodes 14a to 14d and second connecting electrodes 11a to 11d inadvertently.

Fourth Embodiment

Figure 16:
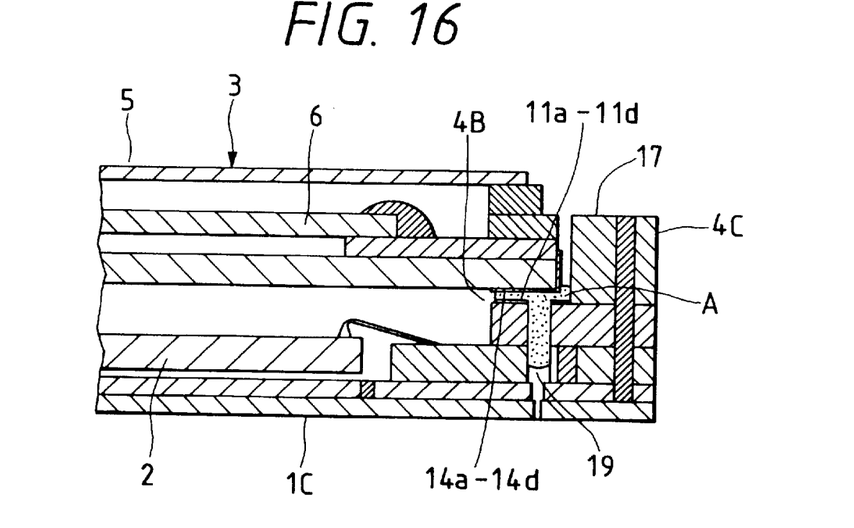
FIG. 16 is a sectional view of a main portion of the front of an oscillator according to a fourth embodiment.

FIG. 16 shows the fourth embodiment.

It may be noted that the same parts and components as those of the first to third embodiments will be described while denoted by the same reference numerals.

As shown in FIG. 16, the fourth embodiment is characterized in that a hole 19 whose diameter is tapered toward the lower portion of a first container 1C is formed in a step 4B portion confronting first connecting electrodes 14a to 14d.

When the first container 1C and the second container 5 are bonded and fixed, a redundant conductive adhesive A is charged into this hole 19 to prevent short-circuiting by a conductive adhesive A spreading outside the first connecting electrodes 14a to 14d and second connecting electrodes 11a to 11d inadvertently.

In this case, if the hole 19 is straight, the conductive adhesive A disadvantageously leaks outside the first container 1C. Therefore, the hole 19 must be structured so that the diameter thereof is tapered in order to prevent leakage. Further, in case of a thermal hardening conductive resin being used as a conductive adhesive A, this hole 19 works to exhaust the gas which is generated during thermal hardening of the thermal hardening conductive resin.

The first container 1C and the second container 5 may be fixed by soldering. However, contaminant such as flux may be attached to the active element 2 so that it may cause some defects. Accordingly, in order to eliminate such defects, the thermal hardening conductive resin is preferable.

While each of the first and second containers is made of a laminated body of ceramic sheets in the aforementioned modes of embodiment, these containers may also be made of glass, ceramics, glass epoxy materials, and the like.

Fifth Embodiment

Figure 17:
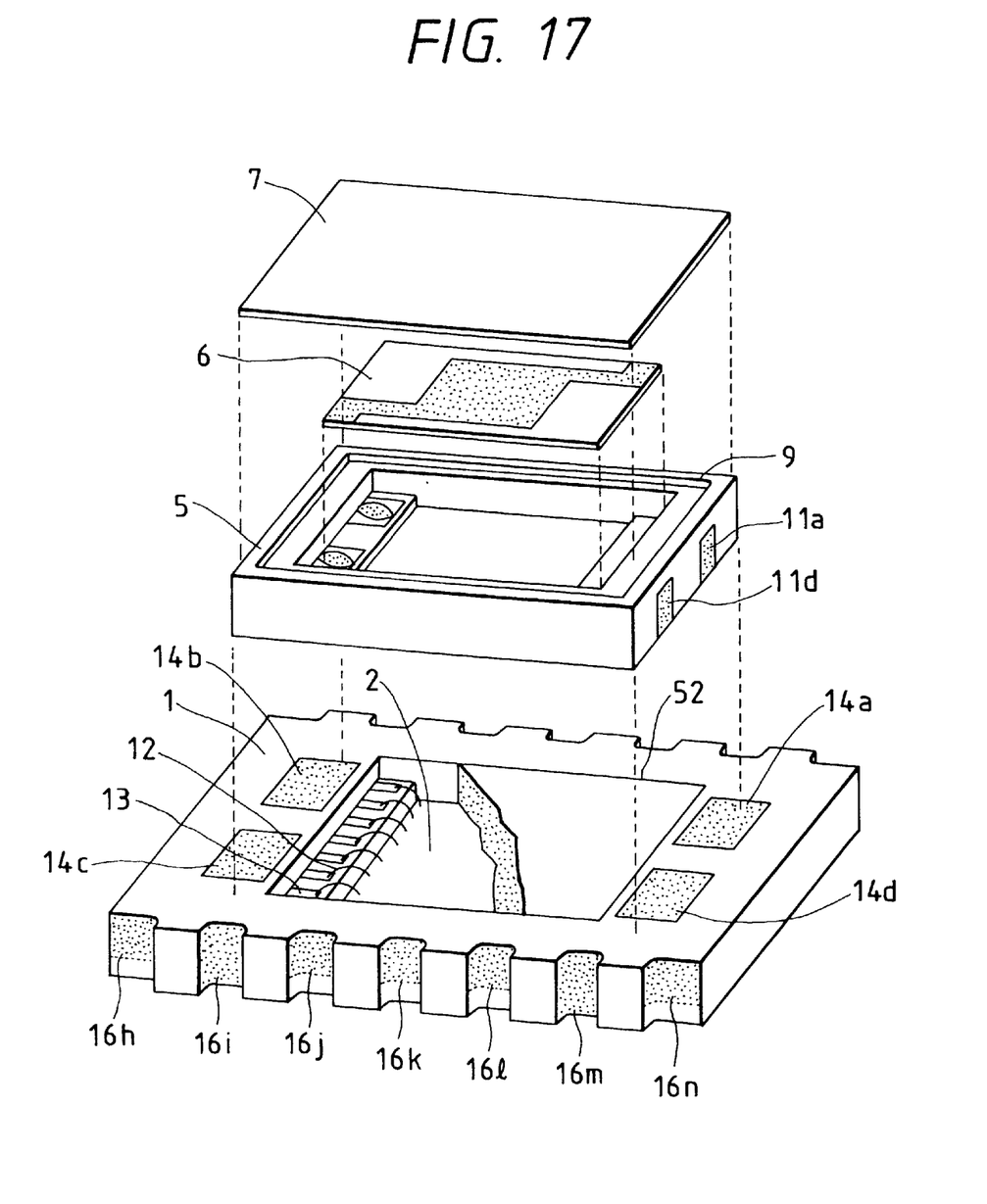
FIG. 17 is an exploded perspective view of an oscillator according to a fifth embodiment.
Figure 18:
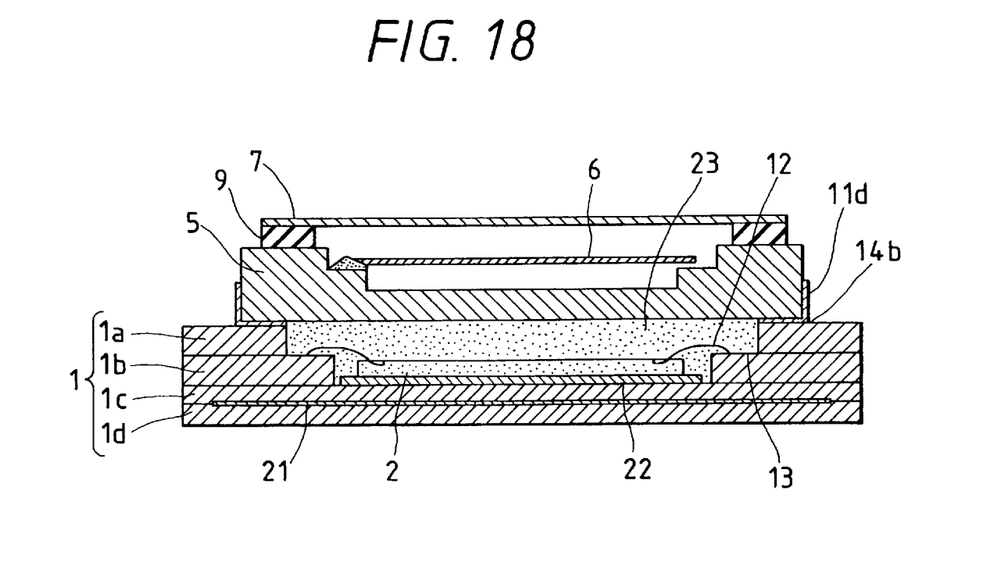
FIG. 18 is a sectional view of the front of the fifth embodiment.

FIGS. 17 and 18 show the fifth embodiment.

It may be noted that the same parts and components as those of the first to fourth embodiments will be described while denoted by the same reference numerals.

As shown in FIGS. 17 and 18, the fifth embodiment is characterized in that an active element 2 and an oscillating element 6 are interposed between a shield plate 7 and a conductive layer 21.

That is, in FIG. 17, the active element 2 is mounted on a die-bonding area 22, is connected to electrodes 13 of a first container 1 with wires 12, and has the entire part thereof coated with a protective resin 23. Here, the first container 1 is formed by laminating ceramic sheets (1a to 1d), and the conductive layer 21 is formed between the ceramic sheets 1c and 1d by printing and is grounded through the internal wiring.

As a result of this construction, effects of electromagnetic fields caused by the wiring patterns of the mother board and effects of electromagnetic fields derived from other devices and circuits close to the mother board can be shielded at the time of mounting the oscillator onto the mother board. Hence, an oscillator with stable output frequency can be implemented.

As described in the foregoing, the invention is characterized not only as accommodating the oscillating element and the active element in separate containers, but also as stacking these containers one upon another. Therefore, there is no likelihood that organic substances emitted from the bond formed by a resin-containing adhesive for fixing the active element onto the oscillating element will deposit, so that deterioration of oscillating characteristics due to deposition of organic substances and the like can be prevented.

Further, even if the active element or the oscillating element is damaged, what is needed is only replace either the first container or the second container. That is, any good parts that are not defective can be reused. Hence, an oscillator that is extremely advantageous also in terms of costs can be implemented.

What is claimed is:

1. An oscillator comprising:
a first container having an upper surface thereof opened;
an active element being mounted inside the first container;
an external electrode being arranged so as to extend from a lower portion to a bottom surface of an outer peripheral wall of the first container;
a first connecting electrode being arranged on the outer peripheral wall of the first container; and
an oscillating unit being mounted onto the outer peripheral wall of the first container so as to cover an opening of the first container;
said oscillating unit comprising:
a second container having an upper surface thereof opened;
an oscillating element being mounted inside the second container;
a sealing plate being attached to an opening of the upper surface of the second container; and
a second connecting electrode being arranged so as to extend from a lower portion to a bottom surface of an outer peripheral surface of the second container;
wherein said second connecting electrode of the oscillating unit is electrically connected to the first connecting electrode of the first container.

2. An oscillator according to claim 1, wherein an inspecting electrode is arranged on an outer peripheral surface of the outer peripheral wall of the first container, and the inspecting electrode is disposed upwardly a predetermined distance from the bottom surface of the first container.

3. An oscillator according to claim 1, wherein an adhesive sealing resin is arranged on an outer peripheral portion of the bottom surface of the second container.

4. An oscillator according to claim 1, wherein a recessed step is formed inside an upper inner peripheral portion of the outer peripheral wall of the first container, and the second container is supported by the step.

5. An oscillator according to claim 4, wherein not only the upper surface of the outer peripheral wall of the first container is arranged so as to be higher than the second connecting electrode of the second container, but also a shield electrode is arranged on the upper surface of the outer peripheral wall of the first container.

6. An oscillator according to claim 4, wherein a notch is arranged at a position on an inner surface side of the outer peripheral wall of the first container corresponding to a position of the second connecting electrode of the second container so as to extend downward from the upper surface side of the outer peripheral wall of the first container to an upper surface of the step.

7. An oscillator according to claim 6, wherein an electrode is arranged on an inner surface of the notch.

8. An oscillator according to claim 6, wherein the notch has an opening and a lower portion opposite said opening, and a conductive adhesive is received in said lower portion of the notch.

9. An oscillator according to claim 4, wherein a hole is arranged at a position on a surface of the step of the first container corresponding to a position of the second connecting electrode on the bottom surface of the second container.

10. An oscillator according to claim 9, wherein the hole of the step of the first container is such that a diameter thereof is tapered downward.

11. An oscillator comprising:

a first container having an upper surface thereof opened;

a conductive body being arranged on a bottom surface of the first container;

an active element being mounted on the conductive body;

a second container being arranged so as to cover an opening of the first container and having an upper surface thereof opened;

an oscillating element being mounted inside the second container; and a shield plate being arranged so as to cover an opening of the upper surface of the second container, wherein by integrating the first container with the second container, the active element is electrically connected to the oscillating element, and also the conductive body and the shield plate are electrically grounded.

12. An oscillator according to claim 11, wherein the first container is formed by laminating ceramic layers and the conductive body is formed by interposing a conductive layer between the laminated ceramic layers.

* * * * *

UNITED STATES PATENT AND TRADEMARK OFFICE
CERTIFICATE OF CORRECTION

PATENT NO. : 5,949,294
DATED : September 7, 1999
INVENTOR(S) : Kondo et al.

It is certified that error appears in the above-identified patent and that said Letters Patent is hereby corrected as shown below:

On the Title Page, Section [73] Assignee, Line 2, after "Japan", add --and Victor Co. of Japan, Ltd., Kanagawa, Japan--.

Signed and Sealed this

Twenty-ninth Day of August, 2000

Attest:

Attesting Officer

Q. TODD DICKINSON
Director of Patents and Trademarks